(12) United States Patent
Mendoza et al.

(10) Patent No.: US 7,084,701 B2
(45) Date of Patent: Aug. 1, 2006

(54) PREVENTING POWER-ON AUDIO OUTPUT NOISE IN A WIRELESS TELEPHONE HANDSET

(75) Inventors: Damien Mendoza, Nice (FR); Jean-Christophe Jiguet, Antibes (FR); Lorenzo Indiani, Villeneuve Loubet (FR)

(73) Assignee: Texas Instruments Incorporated, Dallas, TX (US)

( * ) Notice: Subject to any disclaimer, the term of this patent is extended or adjusted under 35 U.S.C. 154(b) by 741 days.

(21) Appl. No.: 10/245,108

(22) Filed: Sep. 17, 2002

(65) Prior Publication Data

US 2004/0204162 A1 Oct. 14, 2004

(30) Foreign Application Priority Data

May 10, 2002 (EP) .......................................... 02076863

(51) Int. Cl.
*H03F 1/14* (2006.01)

(52) U.S. Cl. .......................................... 330/51; 330/10
(58) Field of Classification Search ................ 330/9, 330/10, 51, 207 A, 251; 381/94.5, 120
See application file for complete search history.

(56) References Cited

U.S. PATENT DOCUMENTS

| 5,199,079 | A | | 3/1993 | Anderson et al. |
|---|---|---|---|---|
| 5,537,081 | A | | 7/1996 | Naokawa et al. |
| 5,682,121 | A | | 10/1997 | Naokawa et al. |
| 6,118,336 | A | * | 9/2000 | Pullen et al. ................. 330/10 |
| 6,605,991 | B1 | * | 8/2003 | Midya et al. ........... 330/207 A |
| 6,734,724 | B1 | * | 5/2004 | Schell et al. .................. 330/10 |

FOREIGN PATENT DOCUMENTS

| EP | 0 678 975 A1 | 10/1995 |
|---|---|---|
| EP | 0785 501 A | 7/1997 |

* cited by examiner

*Primary Examiner*—Khanh V. Nguyen
(74) *Attorney, Agent, or Firm*—Ronald O. Neerings; Wade James Brady, III; Frederick J. Telecky, Jr.

(57) ABSTRACT

A wireless telephone (10) including audio amplifier circuitry (20) that produces reduced "pop" noise in speakers such as in handsfree headsets (HS) is disclosed. The audio amplifier circuitry (20) includes an audio amplifier (22) that drives the headset speaker (HSS). A first transistor (26) has its source-drain path connected between an output (HSO) of the audio amplifier (22) and a power supply voltage ($V_{dd}$), and a second transistor (28) has its source-drain path connected between the amplifier output (HSO) and a reference voltage such as ground. The first and second transistors (26, 28) are controlled by control logic (24), in response to the state of various register locations (30) that indicate the powered-up and enabled state of the audio amplifier circuitry (20). Normal and automatic modes for the precharge control are available, with the automatic mode eliminating the need for the precharge enable register location (30d) being written during operation.

33 Claims, 3 Drawing Sheets

PREVENTING POWER-ON AUDIO OUTPUT NOISE IN A WIRELESS TELEPHONE HANDSET

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of wireless telephones, and is more specifically directed to audio output circuitry for wireless telephones.

The popularity of wireless telephones has greatly increased in recent years, because of many recent improvements in the architecture and performance of wireless telephone handsets. These improvements have provided improved audio fidelity, greater reception range, and increased feature sets, while still reducing the cost of the handset and the wireless service. Improvements in battery technology and also lower power consumption of the telephone circuitry, have improved wireless telephone battery life, which is also a factor in the increased popularity of wireless telephony.

Handsfree accessories have also increased the usability of wireless telephones. As is well-known, the typical handsfree accessory is a headset, including both a microphone and an earpiece. In particular, these accessories also reduce some of the safety hazard associated with using the telephone while driving an automobile. The convenience of modern handsfree accessories is evident from the numerous wireless telephone users that carry out wireless telephone conversations using handsfree accessories even while not driving.

It has been observed, however, that a somewhat loud "pop" sound can be produced at the audio output of a wireless telephone when it is first turned on. This noise is caused by a single-ended output of an audio amplifier making an abrupt voltage transition as it becomes biased. This abrupt transition produces a relatively large output current spike with a sharp rise time, and thus with a wide frequency range including audible frequencies. As this spike propagates to the telephone speaker or earpiece, the result is a "pop" noise. This "pop" noise generally does not occur at the speaker of a conventional wireless telephone, which is a symmetric load receiving a differential output signal; during power-on of the speaker amplifier, both of the differential inputs to the speaker see the same voltage variation, so there is no current variation through the speaker load and therefore no "pop". However, the "pop" noise can be uncomfortably loud through a headset earpiece, which is driven by a single-ended output.

"Pop" noise is also noticeable in other situations. One such situation is in the event of a brief power-down of the amplifier. Typically, one or more capacitors couple the speaker to the audio amplifier, to keep DC components from the amplifier output from propagating to the speaker. If this capacitance discharges too quickly on power-down, a "pop" effect in audible frequencies can be generated. Conversely, if this capacitance does not fully discharge on power-down, remaining charge on the capacitors upon the next power-up of the amplifier can cause a voltage surge that is sufficient to "pop" the headset speaker.

Prior attempts to reduce this "pop" noise, in the context of wireless telephones, has involved the use of passive components external to the integrated circuits including the audio amplifier. These external components of course add to the manufacturing cost of the wireless telephone, and are also not conducive to the reduction of the form factor of the handset, the reduction of which is an ongoing desire in the art. Additionally, the relatively large size of off-chip passive components dissipate significant power, which is of particular concern in battery-powered mobile devices such as wireless telephones.

By way of further background, U.S. Pat. No. 5,537,081 describes audio amplifier circuitry in which the audio amplifier has an input stage-that operates at zero common-mode input voltage, and has an output stage to provide the low voltage end of a voltage swing near ground. This reference also discloses a shunt circuit system to discharge external capacitors, preventing "pop" noise from residual charge at power-up.

BRIEF SUMMARY OF THE INVENTION

It is an object of this invention to provide an analog circuit that is digitally controlled to prevent "pop" noise on power-up of the audio amplifier in a wireless telephone.

It is a further object of this invention to provide such a circuit that requires little integrated circuit chip area.

It is a further object of this invention to provide such a circuit that is programmably controllable.

It is a further object of this invention to provide such a circuit that can also prevent "pop" noise on power-down of the telephone.

It is a further object of this invention to provide such a circuit that can be programmably enabled and disabled.

Other objects and advantages of the present invention will be apparent to those of ordinary skill in the art having reference to the following specification together with its drawings.

The present invention may be implemented by way of precharge and discharge transistors that are connected to the output node of an audio amplifier in a wireless telephone handset. The precharge and discharge transistors preferably precharge the output node, and thus the voltage at an external capacitor coupling the audio amplifier output to a speaker such as an earpiece, to an intermediate voltage. The precharge and discharge transistors are controlled according to the state of a programmable register, and operate in response to the enabling and disabling of voice down link operation, and also in response to the enabling and disabling of the headset output.

DETAILED DESCRIPTION OF THE INVENTION

The present invention will be described in connection with an example of its implementation in a battery-powered wireless telephone used in conjunction with a handsfree headset. This description is provided because it is contemplated that this invention is particularly beneficial when used in such an application. However, it is also contemplated that this invention will be of similar benefit in many other application that are vulnerable to "pop" noise, including mobile audio players, mobile computing devices, and the like. It is therefore to be understood that these and other alternatives to the embodiments described below are contemplated to be within the scope of the invention as claimed.

Figure 1:
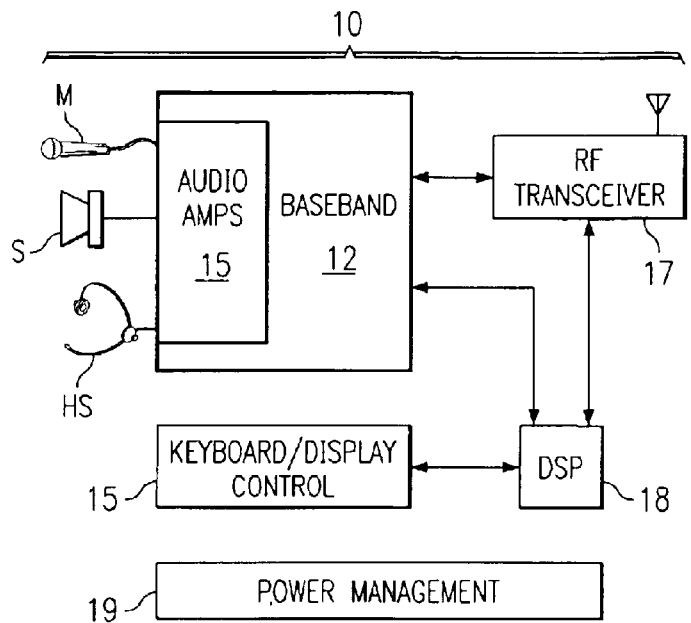
FIG. 1 is an electrical diagram, in schematic form, of a wireless telephone handset according to the preferred embodiment of the invention.

FIG. 1 illustrates, in block form, the construction of wireless telephone 10 according to an exemplary implementation of the preferred embodiment of the invention. As shown in FIG. 1, radio frequency (RF) transceiver 17 is coupled to an antenna, and is responsible for the transmission and receipt of RF signals over the wireless communications network. RF transceiver 17 is bidirectionally coupled to baseband circuitry 12, in this example. In modern wireless handsets, baseband circuitry 12 includes both analog and digital circuitry for processing these user signals. For example, baseband circuitry 12 will include conventional analog amplifiers, and voice-band and radio-frequency coder/decoder ("codec") circuits for encoding and decoding signals into the appropriate form for modulation on the transmit side, and for output to the user on the receive side. According to this embodiment of the invention, baseband circuitry 12 also includes a modulator for modulating the encoded signals into digital phase and amplitude signals for application to RF transceiver 17, and a demodulator for demodulating received signals into a baseband digital datastream.

Digital signal processor (DSP) 18 is coupled to RF transceiver 17 and to baseband circuitry 12, and performs digital signal processing upon the signals to be transmitted and upon received signals, in the manner known in the art. DSP 18 may be implemented as a conventional digital signal processor available in the art, for example a member of the TMS320c5x or TMS320c6x families of digital signal processors available from Texas Instruments Incorporated, having capability for carrying out the necessary digital operations in handset 10. In particular, it is contemplated that DSP 18 may perform a significant amount of digital filtering of the data signals processed by baseband circuitry 12. Indeed, it is contemplated that DSP 18 and baseband circuitry 12 may actually be integrated into a single integrated circuit. DSP 18 also supports some of the support functions of wireless telephone 10, including input and output via keyboard and display control circuit 15, particularly in the case of 3G wireless services in which the payload signals may also include higher complexity signals such as computer and video data. Wireless telephone 10 also includes power management circuitry 19, including such functions as integrated power supplies, low dropout voltage regulators, power supply voltage supervision, battery and temperature monitoring and the like.

Wireless telephone 10 further includes the capability of input and output via keyboard/display and control function 15, particularly in the case of 3G wireless services, in which the payload signals may also include higher complexity signals such as computer and video data. Wireless telephone 10 also includes power source and management function 19, which may include such functions as an integrated power supplies, low dropout voltage regulators, power supply voltage supervision, battery and temperature monitoring and the like.

Baseband circuitry 12 in wireless telephone 10 also includes audio amplifiers 15, which are responsible for receiving and amplifying analog audio input from microphone M, and for receiving and amplifying analog audio output via speaker S. Also in this example, audio amplifiers 15 are also coupled to headset HS, which includes both a microphone and speakers as known in the art. Of course, other input and output devices may alternatively be served by audio amplifiers 15, if desired.

As known in the art, it is contemplated that different specific amplifiers will be used to drive the different output speakers in wireless telephone 10, because of the different load and drive characteristics for speakers of different types and sizes. For example, it is contemplated audio amplifiers 15 will include an amplifier for the handset speaker S, and another separate amplifier for the speaker in headset HS. Also as is known in the art, wireless telephone 10 preferably includes a physical jack into which headset HS is plugged. As well known in the art, the act of inserting the headset plug into that jack will also cause audio amplifiers 15 to disable the amplifier for speaker S, so that audio is not driven both to speaker S and also to headset HS.

Figure 2:
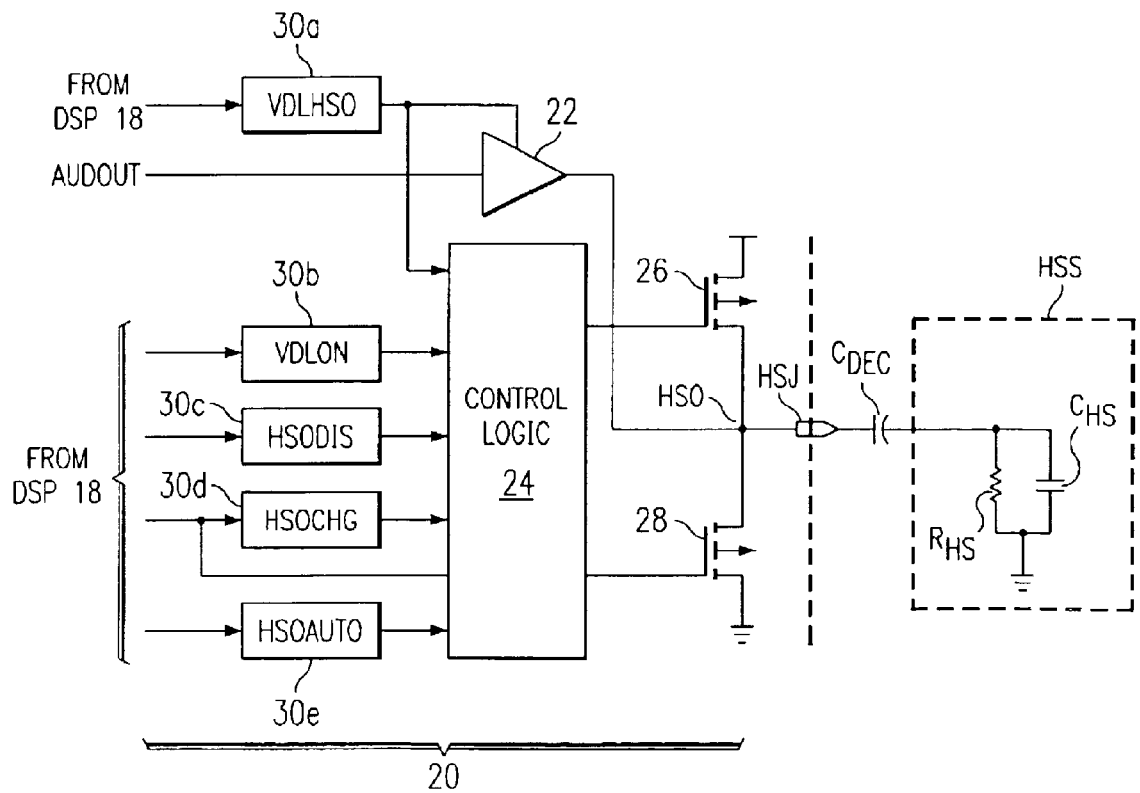
FIG. 2 is an electrical diagram, in schematic form, of audio amplifier circuitry in the wireless telephone handset of FIG. 1 according to the preferred embodiment of the invention.

Referring now to FIG. 2, the construction of headset amplifier circuit 20 according to the preferred embodiment of the invention will now be described. While headset amplifier circuit 20 is preferably embodied within audio amplifiers 15 within baseband circuitry 12 of wireless telephone, as shown in FIG. 1, headset amplifier circuit 20 may alternatively be located elsewhere within the functional architecture of wireless telephone 10.

Headset amplifier circuit 20 is centered about amplifier 22, which is a conventional audio amplifier suitable for driving headset HS. In this example, amplifier 22 receives an analog input signal on line AUDOUT, and drives headset speaker HSS with a single-ended signal from node HSO, through headset jack HSJ. Decoupling capacitor $C_{DEC}$ is also provided in series between node HSO and headset HS, preferably as an external component within wireless telephone 10, to reduce noise at output node HSO. A typical value for capacitor $C_{DEC}$ is 22 µF, which is sufficiently large as to not be integrated within the integrated circuit containing amplifier 22. Amplifier 22 is enabled and disabled by the state of VDLHSO register bit 30a, as will be described in detail below.

As shown in FIG. 2, headset jack HSJ is in place at the boundary of wireless telephone 10, with headset HS being external to wireless telephone 10. Headset speaker HSS presents a load having an impedance equivalent to an RC network of capacitor $C_{HS}$ and resistor $R_{HS}$. For modern headsets, a typical value for capacitor $C_{HS}$ is about 50 pF, and a typical value for resistor $R_{HS}$ is about 32 Ω. This load impedance, in combination with decoupling capacitor $C_{DEC}$, can present a relatively loud "pop" to the wearer of headset HS if power-up of the voice downlink by wireless telephone 10 causes a significant output transient on the single-ended output of amplifier 22 at node HSO.

According to this preferred embodiment of the invention, transistors 26, 28 are provided to eliminate this "pop" noise. In this example, transistors 26, 28 are p-channel metal-oxide-semiconductor (MOS) transistors, coupled in push-pull fashion at node HSO. Of course, transistors 26, 28 may alternatively be n-channel MOS transistors, may be complementary MOS transistors (CMOS), or even bipolar devices. Transistor 26 has its source-drain path connected between power supply $V_{dd}$ and node HSO, while transistor 28 has its source-drain path connected between node HSO and ground. The gates of transistors 26, 28 are driven by control logic 24, as will be described below. The sizes of transistors 26, 28 are preferably selected so that the rise time of the precharge and discharge is preferably within a range of from about 7 msec to about 20 msec, for example about 13 msec. Using current technology, it is contemplated that the average current consumption of transistor 26 during precharge is preferably on the order of 3 mA or less. Of course, the specific sizes and gains of transistors 26, 28 will also depend upon the load presented by headset HS, and other factors.

Control logic 24 receives inputs from various register bits 30, as shown in FIG. 2. It is contemplated that register bits 30 may be written by DSP 18 (FIG. 1), or by other programmable circuitry (e.g., within baseband circuitry 12 or elsewhere within wireless telephone 10), under the control of the user or according to a predetermined sequence of operation. In this example, control logic 30 receives the state of VDLHSO register bit 30a, VDLON register bit 30b, HSODIS register bit 30c, HSOCHG register bit 30d, and HSOAUTO register bit 30e. The functions controlled by these register bits 30 will be describe below, as will the functionality of control logic 24 in controlling the gates of transistors 26, 28. Control logic 24 may be constructed as either combinational or sequential logic, to accomplish the functions that will now be described. It is contemplated that those skilled in the art having reference to this specification will be readily able to implement control logic 24 using conventional realization methods.

According to the preferred embodiment of the invention, transistors 26 and 28 are implemented onto the same integrated circuit as amplifier 22, control logic 24, and also a register containing register bits 30a through 30e. This ability permits the realization of audio amplifier circuit 20 in a low cost manner, in which the power consumed by the circuit elements can be minimized.

VDLON register bit 30b indicates the powered-up or powered-down state of the audio output path. When cleared (i.e., at a "0" state), VDLON register bit 30b indicates that voice downlink is disabled, and when set (i.e., at a "1" state), VDLON register bit 30b indicates that voice downlink is enabled within wireless telephone 10, with the exception of the individual audio amplifiers. In this example, headset amplifier 20 is enabled and disabled by VDLHSO register bit 30a. The cleared state of VDLHSO register bit 30a disables amplifier 22, and communicates the enabled state to control logic 24; conversely, when set, VDLHSO register bit 30a enables amplifier 22 and communicates this state to control logic 24. Of course, with VDLON register bit 30b clear, the state of VDLHSO register bit 30a will not affect the state of amplifier 22.

HSODIS register bit 30c enables and disables the discharging of node HSO through transistor 28. In normal mode, as will be described below, discharge is disabled with HSODIS register bit 30c cleared, and enabled by HSODIS register bit 30c being set. Similarly, HSOCHG register bit 30d, when set, enables precharging of node HSO through both of transistors 26 and 28 in normal mode, while the cleared state of HSOCHG register bit 30d disables precharge. As will be described in further detail below, the state of HSOCHG register bit 30d is set and cleared by control logic 24 itself in an automatic mode when HSOAUTO register bit 30e is set, but is set and cleared by DSP 18 or other circuitry in the normal mode, as indicated by the cleared state of HSOAUTO register bit 30e.

Figure 3A:
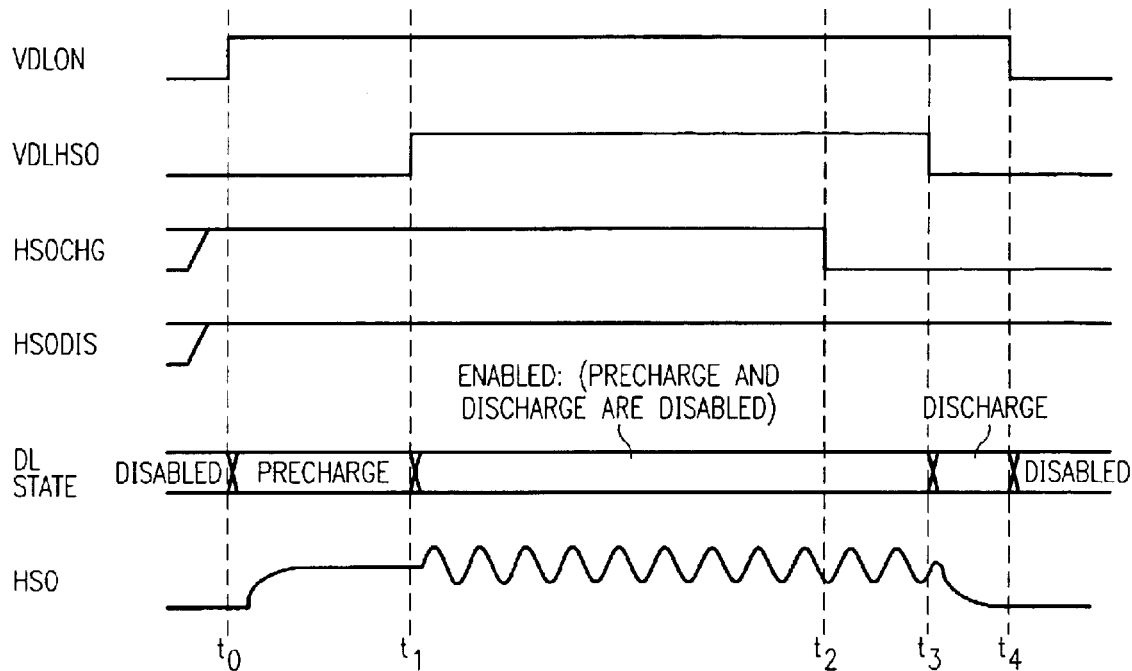
FIGS. 3a through 3c are timing diagrams illustrating the operation of the audio amplifier circuitry of FIG. 2, according to the preferred embodiment of the invention, in preventing audible "pop" noise.

The operation of headset amplifier 20 according to the preferred embodiment of the invention will now be described in detail, in connection with the timing diagram of FIG. 3a. FIG. 3a illustrates this operation in its normal mode, as opposed to its automatic mode (as will be described below relative to FIG. 3b). As described above, the normal (non-automatic) mode is selected by HSOAUTO register bit 30e being cleared.

In this example, in which headset HS is plugged into headset jack HJ, precharge in headset amplifier 20 is enabled at or before time to by HSOCHG register bit 30d being set by DSP 18 or by other control circuitry. Also in this example, HSODIS register bit 30c is set, to enable discharge upon the disabling of the voice downlink. However, the set state of HSOCHG register bit 30d prioritizes precharge over discharge, overriding the effect of HSODIS register bit 30c for the time being. This reduces the number of control register bits that need to be set and cleared during operation.

Prior to time to in the operation of FIG. 3a, VDLON register bit 30a is cleared, indicating that voice downlink in wireless telephone 10 is powered down. Also at this time, VDLHSO register bit 30a is cleared, indicating that audio amplifier 22 is disabled. At time to, voice downlink begins its power-up, preparing, audio amplifier 22 for audio output. The power up is enabled by the setting of VDLON register bit 30a, by DSP 18 or other circuitry. This condition, in combination with HSOCHG register bit 30d already set, causes control logic 24 to place headset amplifier 20 into a precharge state, as evidenced by the line "DL state" in FIG. 3a. Beginning from time $t_0$, as shown in FIG. 3a, control logic 24 turns on both of transistors 26 and 28, precharging output node HSO toward a voltage between power supply voltage $V_{dd}$ and ground, preferably midpoint voltage $V_{dd}/2$. In the example of FIG. 3a, node HSO is precharged by transistors 26 and 28 to its asymptotic level of midpoint voltage $V_{dd}/2$, well before time $t_1$. The sizes of transistors 26 and 28 are preferably optimized so that the precharge of output node HSO to its desired voltage (e.g., $V_{dd}/2$) is carried out timely, yet slow enough that significant amplitude is avoided within audible frequencies and thus the precharge is effectively silent at headset speaker HSS. Alternatively, a single transistor may be used to precharge node HSO to an intermediate voltage (e.g., $V_{dd}/2$) provided by voltage regulation circuitry or a voltage divider within wireless telephone 10.

At time $t_1$, VDLHSO register bit 30a is set, enabling audio amplifier 22 to amplify the audio downlink signal on line AUDOUT into an amplified signal that is applied to headset speaker HSS via node HSO. Control logic 24 responds to the set state of VDLHSO register bit 30a by turning off transistors 26 and 28. Amplifier 22 thus has full control over node HSO, as both precharge and discharge are disabled, and transistors 26, 28 are off. As shown in FIG. 3a, therefore, from time $t_1$, node HSO presents an amplified voltage to headset speaker HSS in response to the signal on line AUDOUT. Because node HSO is precharged to a voltage near $V_{dd}/2$ at time $t_1$ and because audio amplifier 22 initially sets its output to a common output voltage near $V_{dd}/2$ when it is turned on, there is not a significant instantaneous voltage change at node HSO as audio amplifier 22 begins driving headset speaker HSS. Accordingly, the wearer of headset HS is not subjected to a "pop" noise upon the enabling of audio amplifier 22, according to this preferred embodiment of the invention.

Figure 3B:
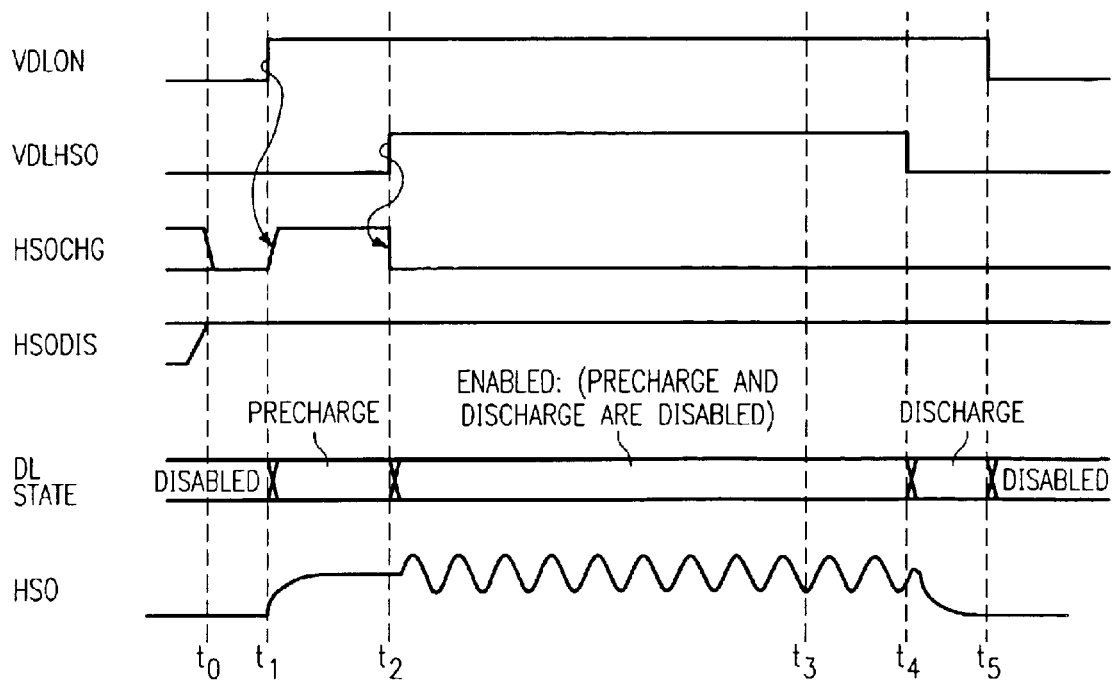

During this output-enabled time, following time $t_1$, HSOCHG register bit 30d is cleared because precharge need no longer be enabled; in the example of FIG. 3a, this occurs at time $t_2$. In the example of FIG. 3b, audio downlink is disabled at a time $t_3$, by VDLHSO register bit 30a being cleared, turning off amplifier 22. The combination of cleared VDLHSO register bit 30a and the set state of HSODIS register bit 30*c* causes control logic 24 to turn on transistor 28, maintaining transistor 26 off. From time $t_3$, therefore, node HSO discharges toward ground through transistor 28.

At time $t_4$, the audio downlink is powered down, by VDLON register bit 30*b* being cleared by DSP 18 or other circuitry; this powering down includes the power-down of audio amplifier 22. However, because node HSO has already been discharged to ground through the action of transistor 28 under the control of control logic 24, there is no significant instantaneous voltage change at node HSO as audio amplifier 22 powers down, and therefore the wearer of headset HS does not hear a "pop" from headset speaker HSS.

Figure 3C:
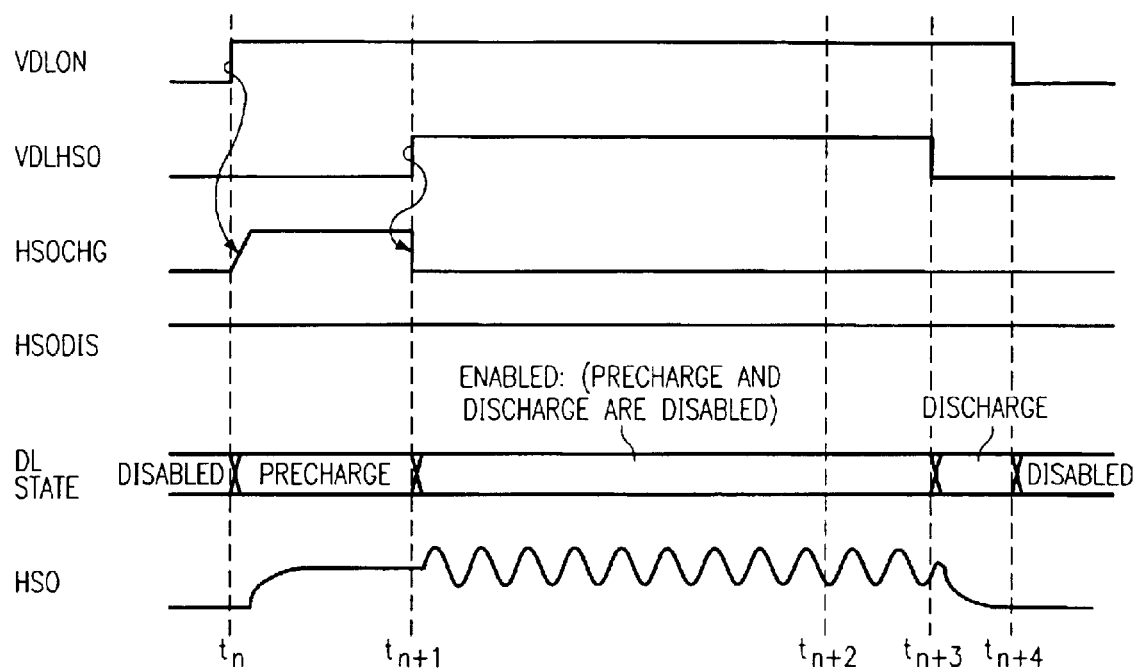

Referring now to FIGS. 3*b* and 3*c*, the automatic mode operation of headset amplifier 20 according to the preferred embodiment of the invention will now be described. As noted above, the automatic mode is selected by DSP 18 or other circuitry in wireless telephone 10 setting HSOAUTO register bit 30*e*. In this automatic mode, the first enabling of the voice downlink path operates differently from successive enabling operations. FIG. 3*b* illustrates the operation of headset amplifier 20 in a first enabling of the voice downlink path in automatic mode according to this embodiment of the invention, while FIG. 3*c* illustrates the operation of headset amplifier 20 in successive enabling cycles of the voice downlink path, in this automatic mode according to this embodiment of the invention.

Prior to or at an arbitrary time to in the example of FIG. 3*b*, DSP 18 configures register 30 for operation. In this automatic mode, VDLON register bit 30*b* and VDLHSO register bit 30*a* are cleared, and HSODIS register bit 30*c* is or becomes set. At time to, in this example, DSP 18 clears HSOCHG register bit 30*d*, and sets HSODIS register bit 30*c*. Headset amplifier 20 is now ready for automatic precharge operation.

At time $t_1$, VDLON register bit 30*b* is set by DSP 18, or such other circuitry that controls register bits 30. Because control logic 24 is operating in automatic mode, by way of HSOAUTO register bit 30*e* being set in this example, the setting of VDLON register bit 30*a* causes control logic 24 to set HSOCHG register bit 30*d*, as shown in FIG. 3*b*. Once HSCCHG register bit 30*d* is set, control logic 24 turns on transistors 26 and 28. The set state of HSOCHG register bit 30*d* takes priority over the set state of HSODIS register bit 30*c*. Precharge of node HSO at the output of audio amplifier 22 is then precharged to a voltage near $V_{dd}/2$, in preparation for audio output. As in the prior case, the precharging of node HSO either eliminates or reduces the amplitude of any instantaneous voltage change at node HSO, and thus eliminates or reduces the audible "pop" at headset speaker HSS.

At time $t_2$, DSP 18 enables audio amplifier 22 by setting VDLHSO register bit 30*a*, following which audio amplifier 22 drives node HSO with an amplified signal corresponding to the signal on line AUDOUT. As shown in FIG. 3*b*, node HSO drives the output signal to headset speaker HSS after the enabling of audio amplifier 22. In addition, in this automatic mode, the setting of VDLHSO register bit 30*a* causes control logic 24 to clear HSOCHG register bit 30*d*. Once HSOCHG register bit 30*d* is cleared, precharge ceases by control logic 24 turning off transistors 26 and 28. Audio amplifier 22 thus freely sets the real-time analog voltage of node HSO, driving headset speaker HSS.

Upon the end of the voice downlink session, at time $t_3$, DSP 18 clears VDLHSO register bit 30*a*. Because HSODIS register bit 30*c* is set, with HSOCHG register bit 30*d* cleared, the cleared state of VDLHSO register bit 30*a* causes control logic 24 to turn on transistor 28, discharging node HSO toward ground. The subsequent powering-down of audio amplifier 22, beginning at time $t_4$ with the clearing of VDLON register bit 30*b*, thus does not cause a "pop" to be heard at headset speaker HSS, because node HSO is already discharged toward ground.

Now that one voice downlink path enabling cycle has occurred, the automatic setting and clearing of the precharge function will occur in subsequent cycles, as shown in FIG. 3*c*. At time $t_n$, VDLON register bit 30*a* is set, causing control logic 24 to then set HSOCHG register bit 30*d* and turn on transistors 26 and 28. The precharge of node HSO toward voltage $Vdd/2$ then begins, and ends at time $t_{n+1}$ with the setting of VDLHSO register bit 30*a* to enable audio amplifier 22. The setting of VDLHSO register bit 30*a* causes control logic 24 to turn off transistors 26 and 28, and to clear HSOCHG register bit 30*d*. Audio signals are then driven at node HSO. At time $t_{n+2}$, the audio downlink session ends with the clearing of VDLHSO register bit 30*a*, which turns off audio amplifier 22. The set condition of HSODIS register bit 30*c*, in combination with the cleared state of HSOCHG register bit 30*d*, causes control logic 24 to turn on transistor 28, so that node HSO discharges toward ground by time $t_{n+3}$, when powerdown commences with the clearing of VDLON register bit 30*b*. The discharge of node HSO eliminates, or at least greatly reduces, the voltage transient at node HSO and thus the "pop" noise at headset speaker HSS, upon powerdown of headset amplifier 20. This repeated operation will thus continue for as many voice downlink cycles as are performed in automatic mode, with HSOAUTO register bit 30*e* set.

In this automatic mode, because of the linking of HSOCHG register bit 30*d* to the other control register bits, and because HSODIS register bit 30*c* is overridden by HSOCHG register bit 30*d* during precharge, DSP 18 need not keep setting and clearing HSOCHG register bit 30*d* during the operation of audio output. Rather, control of precharge and discharge is carried out automatically, under the control of the enabling and power-on signals (VDLHSO, VDLON, respectively) that are conventionally used for operation of the wireless telephone.

According to the preferred embodiment of the invention, therefore, precharge and discharge of the output node, which is driven by the headset amplifier in a wireless telephone, is carried out. The precharge and discharge ensures that much of the transients at the amplifier output will be at frequencies that are not audible through the headset speaker, and limits the amplitude of any remaining power-on and power-off transients that may produce audible components. It is therefore contemplated that this invention will eliminate any significant audible "pop" noise at the headset speaker upon power up and power down of the voice downlink or audio output function.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An audio amplifier circuit, comprising:
    an amplifier, having a signal input receiving an input signal, an enable input receiving an enable signal responsive to which the amplifier is enabled and disabled, and an output coupled to an output node;

a first transistor, having a conduction path coupled between the output node and a selected voltage, and having a control electrode;

a second transistor, having a conduction path coupled between the output node and a reference voltage, and having a control electrode; and control logic, having outputs coupled to the control electrodes of the first and second transistors, and having an input coupled to receive the enable signal, for turning on the first transistor prior to the enable signal enabling the amplifier, and for turning on the second transistor after the enable signal disables the amplifier.

2. The audio amplifier circuit of claim 1, wherein the selected voltage is a power supply voltage;

and wherein the control logic is for turning on both the first and the second transistor prior to the enable signal enabling the amplifier, to precharge the output node to a voltage between the power supply voltage and the reference voltage.

3. The audio amplifier circuit of claim 2, wherein the control logic also receives a power up signal indicating in a first state that audio output is enabled;

wherein a first state of the enable signal enables the amplifier, and a second state of the enable signal disables the amplifier;

and wherein the control logic is for turning on the first and second transistors responsive to the power up signal in its first state and to the enabling signal in its second state.

4. The audio amplifier circuit of claim 3, wherein the control logic is for turning on the second transistor responsive to the power-up signal in its first state and to the enabling signal in its second state.

5. The audio amplifier circuit of claim 4, wherein the control logic also receives a precharge enable signal and a discharge enable signal;

wherein the control logic is for turning on the first and second transistors responsive to the power up signal in its first state and to the enabling signal in its second state, in combination with the precharge enable signal;

and wherein the control logic is for turning on the second transistor responsive to the power-up signal in its first state and to the enabling signal in its second state, in combination with the discharge enable signal.

6. The audio amplifier circuit of claim 5, wherein the control logic is for turning on the second transistor responsive to the power-up signal in its first state and to the enabling signal in its second state, in combination with the discharge enable signal and also in the absence of the precharge enable signal.

7. The audio amplifier circuit of claim 6, further comprising:

a register, having a plurality of register locations, for storing the state of the enabling signal, the power-up signal, the discharge enable signal, and the precharge enable signal.

8. The audio amplifier circuit of claim 5, wherein the control logic also receives an automatic mode signal, indicating in a first state the selection of an automatic operating mode;

and wherein, responsive to the automatic mode signal in its first state, the control logic is also for generating the precharge enable signal in its first state responsive to receiving the power-up signal in its first state.

9. The audio amplifier circuit of claim 8, wherein, responsive to the automatic mode signal in its first state, the control logic is also for disabling the precharge enable signal responsive to receiving the enabling signal in its first state;

and wherein the control logic is for turning on the second transistor responsive to the power-up signal in its first state and to the enabling signal in its second state, in combination with the discharge enable signal and also in the absence of the precharge enable signal.

10. The audio amplifier circuit of claim 1, wherein the amplifier, control logic, first transistor, and second transistor, are disposed in a single integrated circuit.

11. A method of operating an audio amplifier, comprising the steps of:

powering-up the audio amplifier having an audio signal amplifier;

responsive to the powering-up step, turning on a first transistor having a conductive path coupled between a selected voltage and an output of the audio signal amplifier to which a speaker is coupled;

then enabling the audio signal amplifier and turning off the first transistor;

then applying an audio input signal to an input of the audio signal amplifier;

then disabling the audio signal amplifier;

responsive to the disabling step, turning on a second transistor having a conductive path coupled between a reference voltage and the output of the audio signal amplifier.

12. The method of claim 11, wherein the selected voltage is a power supply voltage;

and wherein the step of turning on the first transistor comprises turning on both the first and the second transistor responsive to the powering-up step, to precharge the output of the audio signal amplifier to a voltage between the power supply voltage and the reference voltage.

13. The method of claim 11, further comprising:

receiving an audio signal amplifier enable signal after the power-up step;

wherein the steps of enabling the audio signal amplifier and turning off the first transistor are performed responsive to receiving the audio signal amplifier enable signal.

14. The method of claim 13, further comprising:

receiving an audio signal amplifier disable signal after the power-up step wherein the disabling step is performed responsive to receiving the audio signal amplifier disable signal.

15. The method of claim 14, further comprising:

receiving a precharge enable signal and a discharge enable signal;

wherein the step of turning on the first transistor is performed responsive to the powering-up step in combination with the precharge enable signal;

and wherein the step of turning on the second transistor is performed responsive to the disabling step in combination with the discharge enable signal.

16. The method of claim 15, wherein the step of turning on the second transistor is performed responsive to the disabling step in combination with the discharge enable signal and the absence of the precharge enable signal.

17. The method of claim 11, further comprising:

writing an audio signal amplifier enable register location with a first state;

wherein the step of enabling the audio signal amplifier is performed responsive to the audio signal amplifier enable register location having the first state.

18. The method of claim 17, further comprising:
writing the audio signal amplifier enable register location with a second state;
wherein the disabling step is performed responsive to the audio signal amplifier enable register location having the second state.

19. The method of claim 17, further comprising:
writing a precharge enable register location;
writing a discharge enable register location;
wherein the step of turning on the first transistor is performed responsive to the powering-up step in combination with the precharge enable register location having a first state;
and wherein the step of turning on the second transistor is performed responsive to the disabling step in combination with the discharge enable register location having a first state.

20. The method of claim 18, wherein the step of turning on the second transistor is performed responsive to the disabling step in combination with the discharge enable register location having the first state and the precharge enable register location having a second state.

21. The method of claim 18, further comprising:
writing an automatic mode register location with a first state to indicate an automatic mode, and with a second state to indicate a normal mode;
responsive to the automatic mode register location having the first state and to the step of enabling the audio signal amplifier, writing the precharge enable register location with the second state.

22. A wireless telephone, comprising:
transceiver circuitry, coupled to an antenna, for transmitting and receiving radio frequency signals to and from a wireless communications network;
baseband circuitry, coupled to the transceiver circuitry, for modulating signals to be transmitted by the transceiver circuitry and for demodulating signals received by the transceiver circuitry into baseband audio signal;
audio amplifier circuitry, coupled to a speaker output node, comprising:
an amplifier, having a signal input receiving the baseband audio signal, an enable input receiving an enable signal responsive to which the amplifier is enabled and disabled, and an output coupled to the speaker output node;
a first transistor, having a conduction path coupled between the speaker output node and a selected voltage, and having a control electrode;
a second transistor, having a conduction path coupled between the speaker output node and a reference voltage, and having a control electrode; and
control logic, having outputs coupled to the control electrodes of the first and second transistors, and having an input coupled to receive the enable signal, for turning on the first transistor prior to the enable signal enabling the amplifier, and for turning on the second transistor after the enable signal disables the amplifier.

23. The wireless telephone of claim 22, further comprising:
a headset jack, coupled to the speaker output node, for receiving a headset plug coupled to a headset.

24. The wireless telephone of claim 22, wherein the audio amplifier circuitry is integrated into the baseband circuitry.

25. The wireless telephone of claim 22, wherein the selected voltage is a power supply voltage;
and wherein the control logic is for turning on both the first and the second transistor prior to the enable signal enabling the amplifier, to precharge the speaker output node to a voltage between the power supply voltage and the reference voltage.

26. The wireless telephone of claim 25, wherein the control logic also receives a power up signal indicating in a first state that audio output is enabled;
wherein a first state of the enable signal enables the amplifier, and a second state of the enable signal disables the amplifier;
wherein the control logic is for turning on the first and second transistors responsive to the power up signal in its first state and to the enabling signal in its second state;
and wherein the control logic is for turning on the second transistor responsive to the power-up signal in its first state and to the enabling signal in its second state.

27. The wireless telephone of claim 26, wherein the control logic also receives a precharge enable signal and a discharge enable signal;
wherein the control logic is for turning on the first and second transistors responsive to the power up signal in its first state and to the enabling signal in its second state, in combination with the precharge enable signal;
and wherein the control logic is for turning on the second transistor responsive to the power-up signal in its first state and to the enabling signal in its second state, in combination with the discharge enable signal.

28. The wireless telephone of claim 27, wherein the control logic is for turning on the second transistor responsive to the power-up signal in its first state and to the enabling signal in its second state, in combination with the discharge enable signal and also in the absence of the precharge enable signal.

29. The wireless telephone of claim 28, further comprising:
a register, having a plurality of register locations, for storing the state of the enabling signal, the power-up signal, the discharge enable signal, and the precharge enable signal.

30. The wireless telephone of claim 29, further comprising:
a digital signal processor, for writing the register with the states of the enabling signal, the power-up signal, the discharge enable signal, and the precharge enable signal.

31. The wireless telephone of claim 27, wherein the control logic also receives an automatic mode signal, indicating in a first state the selection of an automatic operating mode;
and wherein, responsive to the automatic mode signal in its first state, the control logic is also for generating the precharge enable signal in its first state responsive to receiving the power-up signal in its first state.

32. The wireless telephone of claim 31, wherein, responsive to the automatic mode signal in its first state, the control logic is also for disabling the precharge enable signal responsive to receiving the enabling signal in its first state;
and wherein the control logic is for turning on the discharge transistor responsive to the power-up signal in its first state and to the enabling signal in its second state, in combination with the discharge enable signal and also in the absence of the precharge enable signal.

33. The wireless telephone of claim 22, wherein the amplifier, control logic, first transistor, and second transistor, are disposed in a single integrated circuit.

* * * * *